United States Patent
Frampton et al.

(10) Patent No.: US 10,114,061 B2
(45) Date of Patent: Oct. 30, 2018

(54) OUTPUT CABLE MEASUREMENT

(71) Applicant: Kohler Co., Kohler, WI (US)

(72) Inventors: Isaac S. Frampton, Strattanville, PA (US); Harrison C. Chiu, Grafton, WI (US)

(73) Assignee: Kohler Co., Kohler, WI (US)

( * ) Notice: Subject to any disclaimer, the term of this patent is extended or adjusted under 35 U.S.C. 154(b) by 0 days.

(21) Appl. No.: 15/362,297

(22) Filed: Nov. 28, 2016

(65) Prior Publication Data

US 2018/0149692 A1    May 31, 2018

(51) Int. Cl.
| | | |
|---|---|---|
| *G01R 31/04* | (2006.01) | |
| *G08B 21/18* | (2006.01) | |
| *H02H 7/06* | (2006.01) | |
| *G01R 31/02* | (2006.01) | |
| *G01R 31/08* | (2006.01) | |
| *G01R 31/44* | (2006.01) | |

(52) U.S. Cl.
CPC .......... *G01R 31/04* (2013.01); *G01R 31/021* (2013.01); *G01R 31/083* (2013.01); *G01R 31/086* (2013.01); *G01R 31/44* (2013.01); *G08B 21/187* (2013.01); *H02H 7/06* (2013.01)

(58) Field of Classification Search
CPC ......... G01R 31/04; G08B 21/187; H02H 7/06
USPC ........................................................ 340/679
See application file for complete search history.

(56) References Cited

U.S. PATENT DOCUMENTS

| | | |
|---|---|---|
| 4,277,740 A | 7/1981 | Parks |
| 4,647,751 A | 3/1987 | Yoshimura et al. |
| 4,999,477 A | 3/1991 | Yamaguchi et al. |
| 5,140,257 A | 8/1992 | Davis |
| 5,424,894 A * | 6/1995 | Briscall ................ H02H 1/0015 361/45 |
| 5,805,394 A * | 9/1998 | Glennon .................. H02H 7/06 322/37 |
| 8,816,872 B2 * | 8/2014 | Newman ............ G05B 23/0267 340/540 |
| 9,787,099 B2 * | 10/2017 | Frampton ................. H02J 3/44 |

(Continued)

FOREIGN PATENT DOCUMENTS

| | | |
|---|---|---|
| CN | 102175341 A | 9/2011 |
| CN | 203323879 U | 12/2013 |

(Continued)

OTHER PUBLICATIONS

European Office Action for German Application No. 17190403.0-1804, dated Nov. 17, 2017.

*Primary Examiner* — Omar Casillashernandez
(74) *Attorney, Agent, or Firm* — Lempia Summerfield Katz LLC

(57) ABSTRACT

A generator system includes a generator controller for monitoring the operation of generator cable. The generator controller is configured to receive a first signal indicative of a generator output and a first connection of a generator cable and a second signal indicative of a second connection of the generator cable. The generator controller is configured to calculate a characteristic value for the generator cable based on the first signal and the second signal and compare the characteristic value for the generator cable to a threshold value. A generator status message or a generator command is generated in response to the comparison. The characteristic value may be resistance of the generator cable.

18 Claims, 13 Drawing Sheets

(56) References Cited

U.S. PATENT DOCUMENTS

| | | |
|---|---|---|
| 2002/0024342 A1 | 2/2002 | Bussinger |
| 2006/0289395 A1 | 12/2006 | Nomizu et al. |
| 2007/0093977 A1* | 4/2007 | Yuan ................. H02H 7/001 |
| | | 702/58 |
| 2008/0170421 A1* | 7/2008 | Kishimoto ......... H02H 7/0844 |
| | | 363/55 |
| 2010/0085205 A1* | 4/2010 | Tompkins ............ G01M 13/04 |
| | | 340/682 |
| 2010/0201373 A1 | 8/2010 | Sato et al. |
| 2011/0210844 A1* | 9/2011 | Dey ................. G08B 13/1445 |
| | | 340/521 |
| 2011/0216453 A1* | 9/2011 | Haines ................. H02H 9/00 |
| | | 361/49 |
| 2012/0035824 A1* | 2/2012 | Sy ................. G01R 31/3004 |
| | | 701/70 |
| 2014/0039817 A1* | 2/2014 | Dayan ................. G01R 31/00 |
| | | 702/58 |
| 2014/0147795 A1* | 5/2014 | Tremblay ............. F23G 7/085 |
| | | 431/5 |
| 2014/0306583 A1* | 10/2014 | Moller ................. H02H 7/06 |
| | | 310/68 C |
| 2015/0253369 A1 | 9/2015 | Boer |
| 2015/0301552 A1 | 10/2015 | Lim |
| 2016/0127135 A1* | 5/2016 | Balasubramanian ... H04L 12/10 |
| | | 713/300 |

FOREIGN PATENT DOCUMENTS

| | | |
|---|---|---|
| CN | 103971182 A | 8/2014 |
| CN | 203893880 U | 10/2014 |
| CN | 105321316 A | 2/2016 |
| JP | 3943067 B2 | 7/2007 |
| JP | 2008232978 A | 10/2008 |
| JP | 2010060313 A | 3/2010 |
| JP | 5619253 B1 | 11/2014 |
| KR | 100657855 B1 | 12/2006 |
| KR | 20070063709 A | 6/2007 |
| KR | 20080040062 A | 5/2008 |
| KR | 101149367 B1 | 5/2012 |
| KR | 1020130031583 A | 3/2013 |
| KR | 20150025052 A | 3/2015 |

\* cited by examiner

41

Cable malfunction detected at phase A.

43

Cable malfunction detected at phase A.

44

45

Warning: Cable malfunction detected. Service will be requested after 3 warnings.

US 10,114,061 B2

OUTPUT CABLE MEASUREMENT

TECHNICAL FIELD

This disclosure relates in general to the measurement of one or more cables of a generator system.

BACKGROUND

An engine-generator set, which may be referred to as a generator or a genset, may include a power source (e.g., an engine) and an alternator or another device for generating electrical energy or power from mechanical energy. The generator may provide backup power in the event of a break in power utility service. Other generator customers may be reliant on the generators for a primary source of power.

The load may be connected to the generator system using one or more cables. In many systems, the generator system including the one or more cables may be installed by the customer. Several problems may arise regarding the cables. Cables may be connected such that phases are mismatched. The contacts of the cable connections may be incomplete, which causes premature failure. Other failures in the cables may occur due to wear, overheating, or physical damage.

The following embodiments include techniques for monitoring generator cables in the case of mismatched cables, incomplete cable connections and failures.

BRIEF DESCRIPTION OF THE DRAWINGS

Exemplary implementations are described herein with reference to the following drawings.

DETAILED DESCRIPTION

In some generator systems, multiple cables may connect the generator to a load. The cables may make parallel connections between the generator and the load, and in some examples multiple redundant cables may be sized to support the entire generator capacity. The generator may provide a portion of the total current to the load through each of the cables. Consider a 600 ampere (A) load on a generator connected to the load through three cables. Each cable may carry 200 A to the load. If one of the cables becomes disconnected, the connection corrodes, or the cable otherwise fails, the other parallel cables may carry more than their rated current. This may cause the temperature of the other cables to increase past the melting or damage point of the insulation, which may potentially result in a failure of the insulation. A failure in the insulation could potentially result in a loss of power to the load and/or a complete failure of the generator system. The disconnection of the cable may be a loose connection in the bus bar. The disconnection of the cable may be a partial disconnection due to corrosion. The disconnection of the cable can be from fatigue-related failure, caused by vibration or other mechanical movement.

Another cable malfunction may occur when a cable becomes disconnected through inadvertent action by the user or another accident that severs, pulls, or jostles the cable. Another cable malfunction may occur when a cable or a cable connection becomes corroded. Other problems may occur when the cable is not correctly connected by the user. The following embodiments monitor one or more cables for changes in resistance that are indicative of a cable malfunction.

Figure 1:
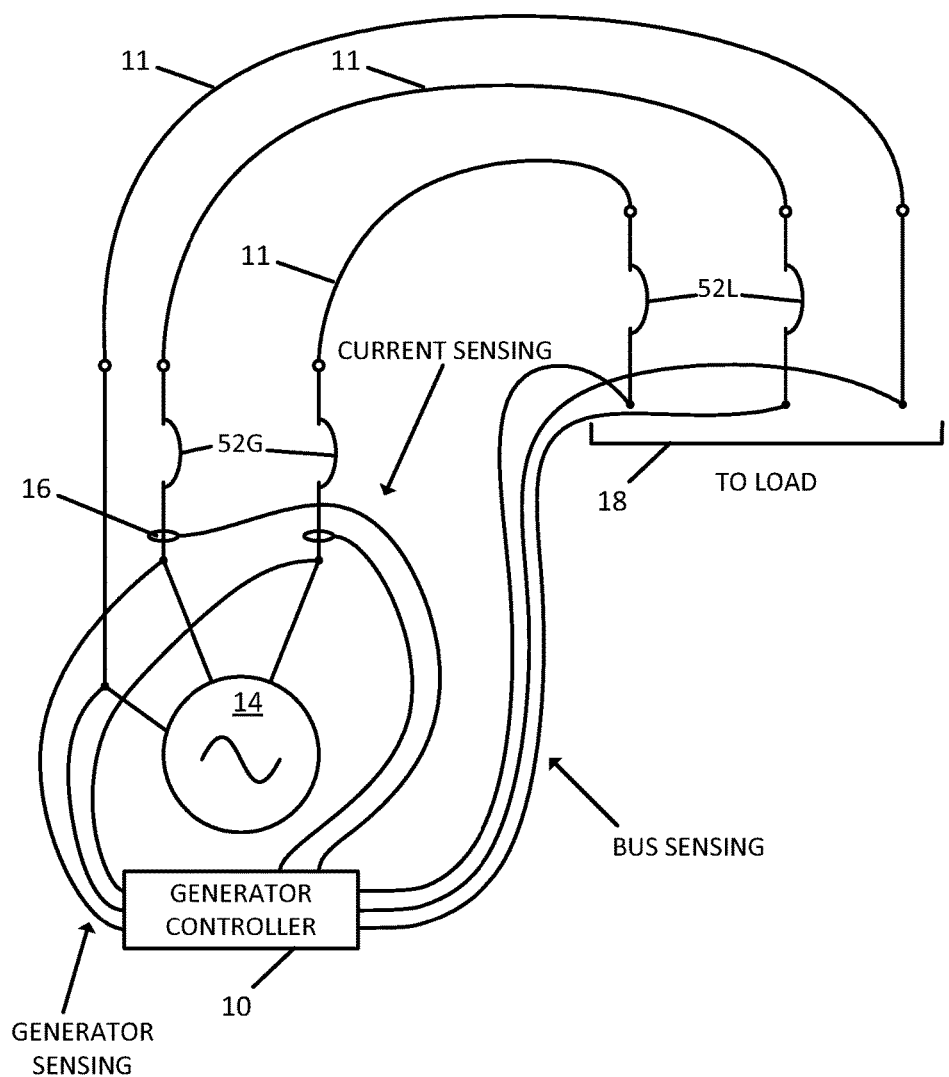
FIG. 1 illustrates an example single phase generator system for cable measurement.

FIG. 1 illustrates an example single phase generator system for cable measurement. The generator system includes a generator controller 10, an engine-generator set or genset 14, a generator side breaker 52G, a generator cable 11, and a load side breaker 52L. Breakers 52G and 52L are representative of a variety of switching devices for selectively connecting and disconnecting an electrical device from another, include circuit breakers, contactors, vacuum fault interrupters, oil-filled disconnect switches, manually-operates disconnect switches, knife-blade disconnects, and mechanically fastened jumpers. One measurement point 16 corresponds to genset side of generator cable 11 and another measurement point 18 corresponds to a load side of the generator cable 11. Addition, different, or fewer components may be included.

The genset 14 includes a prime mover, which may be an engine, with one or more cylinders and a combustion chamber that receives fuel and combusts the fuel to move the cylinders in a reciprocal motion to rotate a shaft mechanically coupled to an alternator. The fuel may be gasoline, compressed natural gas, propane or another example fuel. The generator controller 10 may provide an ignition control signal (e.g., spark module signal) for initiating the combustion in the combustion chamber for causing the reciprocal motion. The generator controller 10 may provide a control signal for the fuel being delivered to the engine or control a regulating valve for the air passing through the engine. As another alternative, the engine ignition, fuel and air control may be performed by a separate module (e.g., engine control module or ECM), which receives commands from the generator controller 10.

The generator controller 10 may provide protective functions for the engine based on one or more parameters measured by the controller or the ECM or another device. The generator controller 10 may also provide protective functions for other elements in the power system, such as an alternator connected to the engine. The alternator may be a controlled field alternator in which a field current is actively controlled by the generator controller 10 to adjust the output of the alternator. Alternatively, the alternator may include permanent magnets for providing the excitation current for producing a magnetic field in the alternator. The alternator may be configured to generate a poly-phase signal through operation of the engine. Alternatively, the alternator may be configured to provide a single-phase electrical signal through operation of the engine.

The alternator may include an exciter armature for generating the field current. As the exciter armature is rotated in a magnetic flux, a time varying voltage is induced in the windings of the exciter armature. The output from the exciter armature is connected to the main field portion of generator. The connection may be made with or without brushes and slip rings. The field current of the output of the exciter provides a magnetic field in rotor field of the generator. As the field portion of the alternator is rotated relative to the stator, a magnetic flux is passed through and across the alternator stator windings producing time varying voltage. The field current from the exciter armature output may be rectified or otherwise controlled. The output of the alternator may be a single phase signal or a three phase signal.

The generator controller 10 controls the operation of the genset 14. The generator controller 10 may generate generator commands including one or more of a paralleling command, a start command, a stop command, a throttle command, a load command, a speed command, an operational mode command, a self-protection command, or a sequence command. The parallel command may include an instruction to connect a generator (e.g., genset 14) to the bus such as a close command to the generator side beaker 52G. The start command may include an instruction (e.g., ignition signal or starter motor signal) to start the genset 14. The stop command may include an instruction to shut off the genset 14 such as a signal that grounds one or more spark plugs or a signal that closes a fuel solenoid. The throttle command may include an instruction to reduce or increase a supply of fuel or air to the genset 14. The load command may include a breaker command to close or open the load side breaker 52L or a command to control the power output from the engine.

A speed command may be a desired speed sent to the engine. An operational mode command may switch operational modes of the engine or alternator, such as a warmup idle mode, where the engine runs at a reduced speed and the alternator outputs a reduced voltage. A self-protection command may decrease airflow, decrease fueling, retard ignition timing, increase fueling, or perform some other action to minimize the damage on the engine. A sequence command may initiate a specific sequence, such as an over-speed test sequence where the engine intentionally increases in speed above a protective limit.

The load 12 may be an electrical consumption device such as a residence, a factory, a commercial facility, a medical facility, a military installation, a government building, or an infrastructure provider (e.g., communications or transportation infrastructure). The genset 14 and the load 12 may be spaced apart by a distance. The distance may be sufficient to separate the noise and/or exhaust of the genset 14 from the load 12. The distance may be spanned by the generator cable 11. The generator cable includes at least an electrically conductive portion and, optionally, an insulation portion. The insulation portion may surround the electrically conductive portion and may have a maximum allowable temperature of operation of the inner conductor.

The measurement point 16 corresponds to the generator side of the generator cable 11 and the measurement point 18 corresponds to the load side of the generator cable 11. One or both of the measurement point 16 and the measurement point 18 may include either an open loop sensor or a closed loop sensor.

The measurement point 16 and the measurement point 18 may collect data for the generator cable 11 at every cycle of the electrical signal. Data may be collected at a rate defined by the inverse of the frequency. Samples may be collected at a predetermined rate (e.g., 1 kilohertz (kHz), 3 kHz, or 6 kHz). The data collected by the measurement point 16 and the measurement point 18 may be root mean square (RMS) values for the electrical parameters of the cable 11. The data collected by the measurement point 16 and the measurement point 18 may average over a predetermined time period (e.g., 1 second, 2 seconds, or another value). Alternatively, instantaneous values for the electrical parameters may be used.

A non-contact sensor measures an electrical property of the measurement point 16 without being electrically coupled to the conductor of the generator cable 11. For example, the non-contact sensor may be an induction sensor that loops around the generator cable 11 and the measurement point or clamps onto the generator cable 11. The non-contact sensor may be a Hall sensor configured to detect current that flows through an air gap of the non-contact sensor formed by a magnetic core. The generator cable 11 place in the air gap creates a magnetic field proportional to the current traveling through the generator cable 11. The magnetic field induces a current in the Hall sensor, which may be amplified before being sent to the generator controller 10.

On the other hand, the contact sensor may be connected to a sensing circuit that also includes the generator cable 11. The contact loop sensor may directly measure the voltage or current of the generator cable 11. In one example, the contact loop sensor is a voltage sensor between the conductor of the generator cable 11 and a ground connection. The voltage sensor may be connected in parallel with the generator cable 11. In another example, the contact loop sensor is a current sensor in line with the generator cable 11. The current sensor may be connected in series with the generator cable 11.

The measurement point 16 and/or the measurement point 18 may be a current transformer that produces an output level (e.g., current or voltage) proportional to a sensed level. The current transformer comprises a primary winding, a second winding, and a core. The core may be formed of a magnetic material such as iron. The secondary winding may be wire wrapped many times around the core. The primary winding may pass through the core once or be wrapped around the core a few times. The primary winding may also be a portion of the measured circuit.

The measurement points 16 and 18 may be in a variety of positions. In one example, the measurement points 16 and 18 are opposite ends of the generator cable 11. For example, each or either of the measurement points 16 and 18 may be integrated with a connector of the generator cable 11. Each or either of the measurement points 16 and 18 may be integrated with taps where the generator cable 11 connects. The taps are the connectors at the ends of the generator cable 11. The measurement points 16 and 18 may be included within the alternator winding terminations or be connected to dedicated coils in the alternator In other examples, one or more measurement points, current transformers, or sensors may provide data to a supplemental controller in communication with the generator controller 10. The supplemental controller may be an automatic transfer switch (ATS) controller or a switchgear controller. The ATS or the switchgear may connect the load to the generator and one or more other sources such as a utility source or another generator source. The ATS may receive a manual input from the user to switch power for the load from the generator to the other source, and vice versa. The ATS may receive an automatic input signal to switch the load from the generator to the other source based on an event such as generator failure or warning or utility failure or warning.

The cable measured in these embodiments may extends from the load to the ATS or from the ATS to the generator. One measurement point may correspond to the ATS side of a cable and the other measurement point may correspond to the load side of the cable. One measurement point may correspond to the ATS side of a cable and the other measurement point may correspond to the source side of the cable. Data collected by the measurement points may be analyzed by the supplemental controller according to the examples described herein. Alternatively, the supplements controller sends data from the measurement points to the generator controller 10.

Figure 2A:
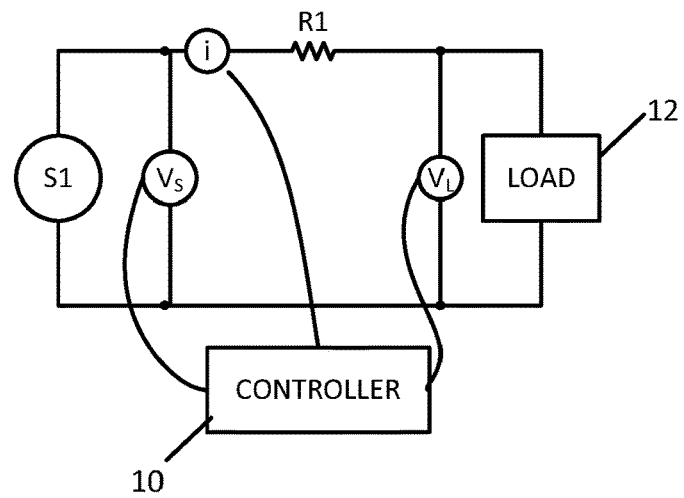
FIG. 2A illustrates cable measurement in an example system.

FIG. 2A illustrates cable measurement in an example system. A source S1 is connected to a load 12 through a cable modeled as resistance R1. The generator controller measures a current (i) (e.g., via a current sensor) through the resistor R1 or cable, a voltage $V_S$ at the source (e.g., via a first voltage sensor), and a voltage $V_L$ at the load 12 (e.g., via a second voltage sensor).

The generator controller 10 receives a first signal from a sensor at the measurement point 16 indicative of a generator output and a first connection of a generator cable and a second signal from a sensor at the measurement point 18 indicative of a second connection of the generator cable. The first signal and the second signals may be analog signals such as a sinusoidal wave with an amplitude that is proportional to an electrical parameter of the generator cable 11. The electrical parameter may be a voltage level or a current level or both the voltage level and the current level. The electrical parameter may be a characteristic value for the generator cable 11. In other examples, the first signal and the second signals are digital signals that include data indicative of the electrical parameter. The digital signals may include a pulse width modulated signal that describes the electrical parameter. The digital signals may include a data packet with textual data that describes the electrical parameter.

The cable characteristic value may be resistance, inductance, temperature, ground leakage, insulation thickness, proximity to ground (using capacitance, propagation time, or other methods), connector seating quality, corrosion, insulation damage and cable movement among other measurements. When resistance is measured, in one example, the current may be considered constant. The current may be a predetermined current or measured current required by load 12. For example, when the load 12 is an electrical device rated at 100 A, the generator controller 10 uses 100 A for the following calculations.

In another example when resistance is the cable characteristic measured, the current is variable. The current may be measured at either the load 12 or at the generator cable 11. The current at the load 12 may be monitored internally by the load 12, or by a load sensor, which may be a current sensor, coupled to the load 12. The sensors at the measurement point 16 and the measurement point 18 may measure the current at the generator cable 11.

In any of these scenarios, the first and second signals are indicative of voltage levels at either end of the generator cable 11. Thus, a difference between the first signal and the second signal is analogous of a voltage drop across the generator cable 11. The generator cable 10 may calculate the voltage drop by subtracting the voltage level of the second signal from the voltage level of the first signal. The generator cable 10 may calculate an absolute value of the difference of the signals.

The generator controller 10 is configured to calculate a resistance for the generator cable 11 based on the first signal and the second signal using the voltage drop and the current levels. The generator controller 10 may divide data indicative of the voltage drop by data indicative of the current level. The resistance for the generator cable 11 may be an alphanumeric value or a fractional value.

The generator controller 10 may compare the resistance value to a threshold value. The threshold value may be a set percentage of the rated resistance of the generator cable 11. The resistance may be defined per unit length or adjusted according to length of the generator cable 11. Example resistances per unit length may be in the range of 0.01 ohms per meter to 0.50 ohms per meter, such as 0.02 ohms per meter or 0.05 ohms per meter. In addition, or in the alternative, the resistance may be defined according to the material (e.g., copper, aluminum, nickel, copper, clad, steel) of the conductive portion of the generator cable 11.

As an example, the resistance of output cable R1 can be computed as:

$$R_1 = (V_S - V_L)/I \qquad \text{Eq. 1}$$

In cases where the Voltage or Current has a time-varying nature to it, the resistance of output cable $R_1$ can be computed by first computing real power. The real power is defined as the sum of the product of instantaneous current and voltage over a time window. The resistance can be computed as the ratio of the square of the voltage to the power:

$$R_1 = (V_S - V_L)2/P \qquad \text{Eq. 2}$$

Other ways to measure the resistance of the output cable $R_1$ include taking instantaneous voltage to current ratios, taking instantaneous voltage to power ratios, comparing root mean squared (RMS) quantities over a cycle, comparing RMS quantities over many cycles, comparing RMS quantities over a partial cycle, establishing the resistance as a real element of a complex impedance, and deriving the resistance from a voltage divider with the load with a known or computed load resistance.

The inductance of the output cable $R_1$ can be calculated once the resistance is determined by measuring the time required for the output current to reach stabilization, the phase offset introduced to a time-varying and cyclic waveform, the ratio of the square of the voltage to reactive power, taking the imaginary component of a complex impedance, comparing instantaneous voltage to a phase offset current, and comparing a phase offset instantaneous voltage to the measured current, among other techniques.

As an example, if the resistance of the cable is known, the inductance can be computed by comparing the time constant, L/R, with the time required to reach 63% of final value. With R known, L can be computed as L=(time to reach a set percentage (e.g., 63%))*R.

As another example, if the phase offset between the current and voltage is an angle Z (e.g., 32°), the inductance of the circuit may be computed as L=R*TAN(Z) L=R*TAN(32°). TAN is the tangent function.

In one example, the resistance threshold is associated with a previous resistance calculation for the generator cable 11. A baseline for the resistance threshold may be set when the generator cable 11 is first installed, or when the generator controller 10 is first installed or activated. The baseline may be set on a periodic basis (e.g., every day or once a month). The baseline may be set based on the operation of the genset 14. For example, the baseline resistance may be detected when the genset 14 starts running. Thus, each time the genset 14 is turned off, the resistance baseline is reset or determined again.

In one example, the threshold is associated with a constant value. The constant value may be preprogrammed in the generator controller 10 or stored in memory. The constant value for the resistance threshold may be selected according to the type of cable used for the generator cable 11, the throttle level for the genset 10, or the type of load 12.

The generator controller 10 determines whether the resistance of the generator cable 11 deviates from the threshold by a reference amount. The generator controller 10 determines whether the resistance of the generator cable 11 is abnormally high or abnormally low. Based on the comparison of the resistance value to the threshold, the generator controller 10 is configured to generate a generator status message or a generator command.

In addition, the generator controller 10 may detect a rate of resistance rise, a difference of resistance between phases, change in the rate of resistance rise at a given current, and other resistance behavior based on models or complex algorithms. The generator controller 10 may compute a temperature from the resistance and protect the insulation on the cable. The generator controller 10 may estimate a material type from the rate of change of the cable resistance, the total change in cable resistance, or a model involving various parameters.

Figure 10:
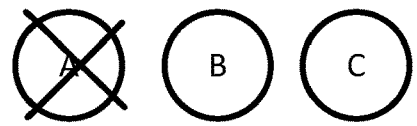
FIG. 10 illustrates example output messages in response to the cable measurement.

Examples for the generator status message may include messages of various levels. The generator status message may include a level based on content such as a diagnostic message, a maintenance message, or a warning message. FIG. 10 illustrates some example generator status messages.

The diagnostic message (e.g., message 41) may include a textual message that a cable malfunction has been detected. The diagnostic message may indicate that the resistance of the generator cable 11 is abnormally high or abnormally low. The diagnostic message may indicate that a cable is loose or has become corroded. The diagnostic message may indicate a number of abnormal tests that have occurred and indicate that automatic action will be taken if a certain number of tests are failed.

The maintenance message (e.g., message 43) may include instructions for inspection of or correction of the detected cable malfunction. The maintenance message may include a graphic (e.g., diagram 44) or step by step instructions for corrected of the detected cable malfunction. The maintenance message may indicate that a technician has been contacted or dispatched to the generator system.

The warning message (e.g., message 45) may include a time line or condition that remedial action will be taken by the generator controller 10. The remedial action may include disabling the generator system. The remedial action may include contact a service technician. The warning message may include a value for a number or quantity of future messages that will trigger the remedial action.

The generator status message may include a level based on urgency or imminence. For example, the generator status message may include an indication of low urgency, medium urgency, or high urgency. For any given detected malfunction, the first message may indicate a low urgency, a second or subsequent message may include a medium urgency, or third or more subsequent message include a high urgency.

Examples for the generator command may include a command to stop the genset 14. The stop command may include an instruction to shut off the genset 14 such as a signal that grounds one or more spark plugs. In one example, the generator controller 10 generates the stop command when the resistance of the generator cable 11 deviates from the threshold by a set amount. Examples for the generator command may include throttle command that decreases the torque or speed of the engine of the genset 14. The genset 14 may be slowed when the resistance of the generator cable 11 deviates from the threshold by a set amount. Examples for the generator command may include a breaker command. In one example, the breaker command opens the breaker 52G to disconnect the genset 14 from the generator cable 11. In another example, the breaker command opens the breaker 52L to disconnect the generator cable $L_1$ from the load 12.

The generator controller 10 may send the cable characteristic information to the supplemental controller (e.g., ATS controller). The ATS controller may receive cable characteristic information from multiple controllers or measurement devices. For example, the ATS controller may receive cable characteristic information from multiple generators, one or more uninterruptible power supplies and/or one or more utility sources. The ATS controller may also receive measurement data for cables between the ATS and the load. The ATS controller may monitor cables from monitor devices including any combinations of generators, utility sources, and loads. The ATS controller may generate a message in response to a deviation in the cable characteristic, or a combination of deviations in cable characteristics in two or more of the generators, the uninterruptible power supplies, and/or the utility sources. The message may be an instruction for the generators, the uninterruptible power supplies, and/or the utility sources, and or include a status message, a diagnostic message, a maintenance message, or a warning message, and described herein. The ATS controller may generate a switching instruction in response to a deviation in the cable characteristic, or a combination of deviations in cable characteristics in two or more of the generators, the uninterruptible power supplies, and/or the utility sources. The switching instruction may be a command to switch a load connected to the ATS, a command to switch a source connected to the ATS, or a command to connected a predetermined pair of load and source.

Figure 2B:
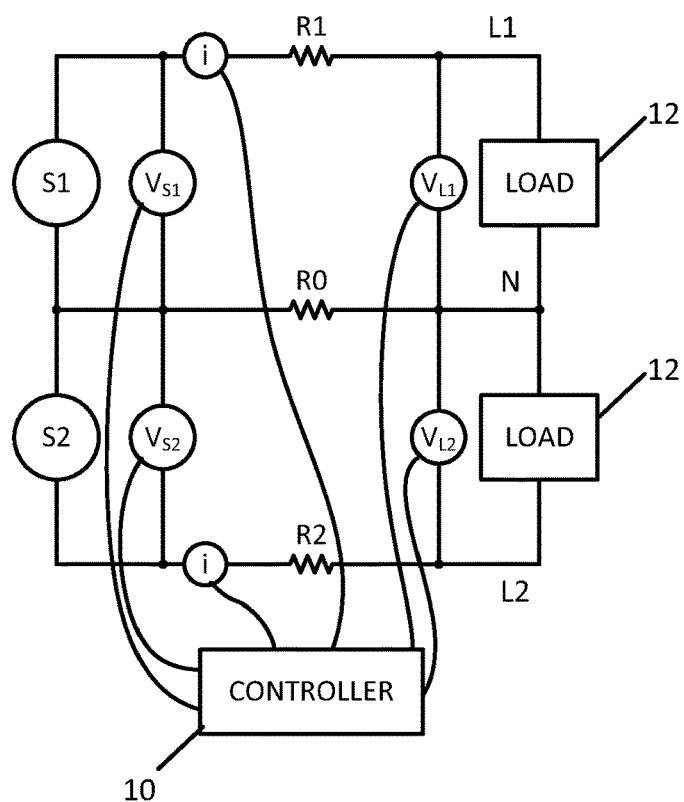
FIG. 2B illustrates a representative single-phase system for cable measurement.

FIG. 2B illustrates a representative single-phase system for cable measurement. The generator may be connected to the load via three cables, $L_1$, $L_2$ and N (neutral). While the current on the neutral is zero with a balanced load, it is not zero when the load is imbalanced. Due to this factor, the neutral current must be taken into account when measuring a characteristic of the output cables.

For example, if $i_1$, the current on $L_1$, is 40 A and $i_2$, the current on $L_2$, is only 20 A, the current on the neutral will be 20 A. Because of this neutral current, voltages $V_{L1}$ and $V_{L2}$ will measure against a different reference than voltages $V_{S1}$ and $V_{S2}$. For example, voltages $V_{S1}$ and $V_{S2}$ may both read 120V, but $V_{L1}$ may read 117V while $V_{L2}$ may read 120V due to a 1V drop on the neutral wire in phase with $L_1$.

To compute the voltage drop on the phase wires, the neutral current can be computed and taken into consideration. If the neutral current is sufficiently small, more accuracy can be obtained in the measurement of the phase cable characteristics. If the neutral current is large, the characteristics may not be individually measurable, requiring fault detection to rely on relative or comparative quantities.

The cable characteristics may include resistance, inductance, temperature, ground leakage, insulation thickness, proximity to ground (using capacitance, propagation time, or other methods), Connector seating quality, corrosion, insulation damage and cable movement among other measurements.

In some cases, the resistance of the neutral may be significantly lower than the resistance of the phase conductors, such as the case where the neutral is bonded to the ground and both wires are full-size. In other cases, the resistance of the neutral may be significantly higher than the resistance of the phase conductors, such as applications where the neutral is undersized because the load is largely balanced.

In other cases, a single-phase generator may not have a neutral connection, or the neutral connection may be provided by one of the phase conductors. In this case, the cable measurement can be presumed to have no current on the neutral, thus the calculations for cable characteristic for the phases are simplified.

Figure 3:
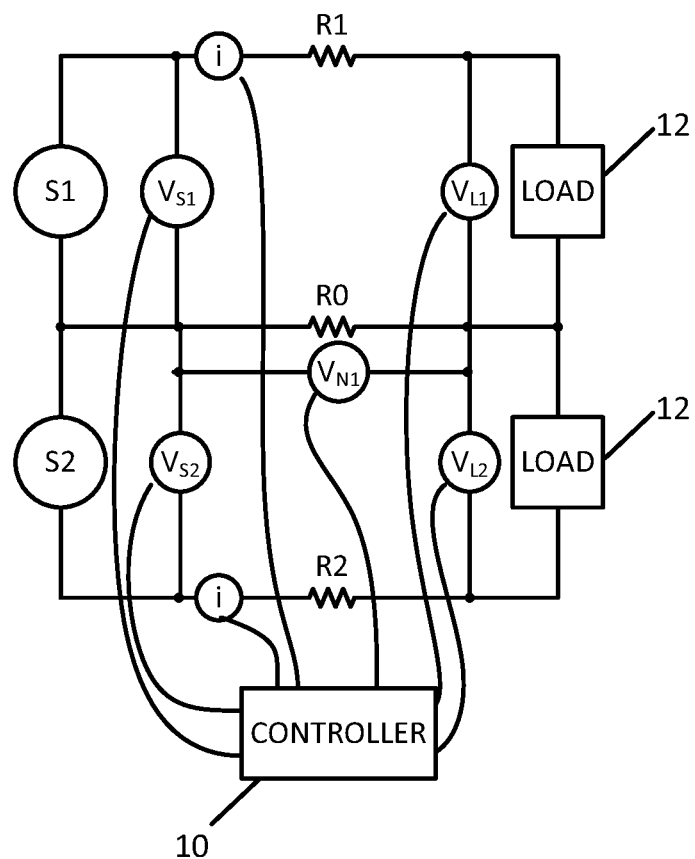
FIG. 3 illustrates a representative single-phase system for cable measurement including measurement of the voltage between the neutral points.

FIG. 3 illustrates a representative single-phase system for cable measurement including measurement of the voltage between the neutral points. FIG. 3 includes a measurement device to measure the voltage between the load neutral and the generator neutral. This technique provides one technique to measure individual cable characteristics by providing a measurement device for the actual voltage across each of the cables, as denoted by $R_1$, $R_2$ and $R_0$ in FIG. 3. Other techniques include measuring the voltage across $R_1$, the voltage across $R_2$, or a combination of these factors. This technique can be performed without the addition of wiring to the generator controller 10 if the neutrals are already included in the measurement package.

Figure 4:
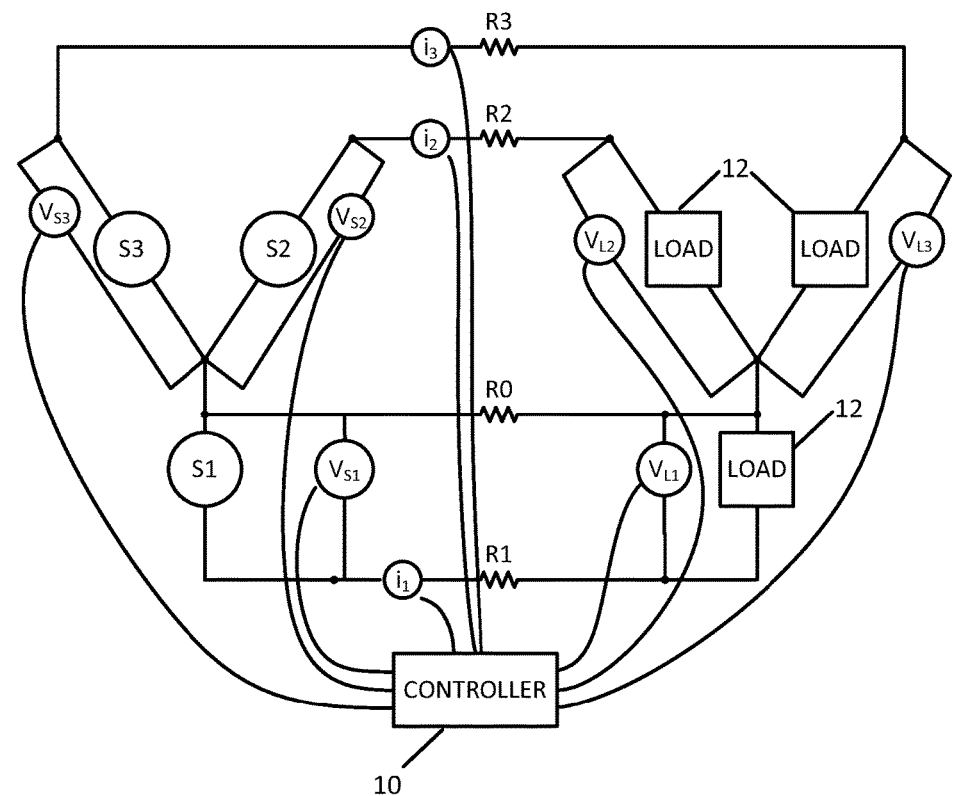
FIG. 4 illustrates a representative three phase system for cable measurement.

FIG. 4 illustrates an example three-phase system for cable measurement. This system provides power through up to three conductors, with a neutral conductor to allow imbalanced current a path to return to the source.

Cable characteristics can be measured using the same technique as the single-phase calculations. Current on the neutral poses similar difficulties with the 3-phase system as with the single-phase system, but they can be avoided by measuring additional voltages or any cable faults can be established based on relative values or observed changes, similarly to the single-phase case.

Applications where the three-phase load is connected without a neutral path are simply a special case of the system in FIG. 4, the characteristics may be computed using the same technique and assuming no neutral current.

Figure 5:
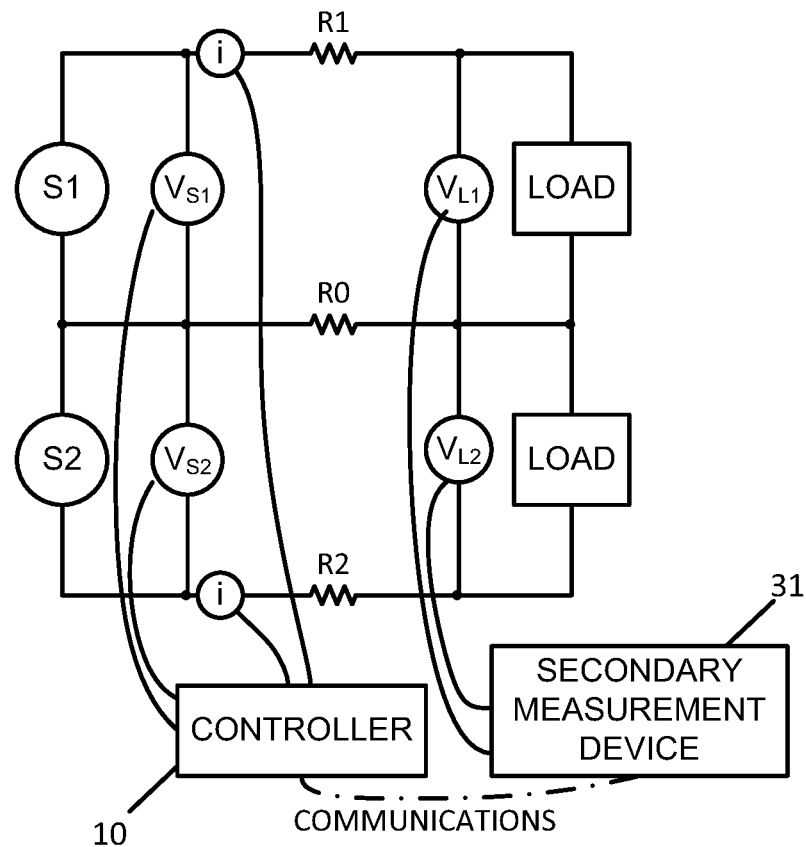
FIG. 5 illustrates an alternate topology for cable measurement.

FIG. 5 illustrates an alternate topology for cable measurement and a secondary technique for measuring cable characteristic of a system, where the load voltages are established by a different device and transmitted to the controller via a communication medium.

This technique may be used to compare RMS voltage over an entire cycle, a partial cycle, or multiple cycles. It may also be used to measure a DC quantity at a known period. It may be used to detect changes, it may be used to establish instantaneous samples for comparison by providing a high-speed communication architecture and a synchronization device or architecture.

While this technique may make measurement of the neutral differences difficult, it is also possible to provide a reference voltage over the communications line. And compare both neutral voltages to it, subtracting the reference out of the final calculation. This technique is made easier by providing a synchronization device and high-speed communication.

The secondary measurement device 31 may be another generator controller, a remote module associated with the generator controller 10, or may be a remote module associated with multiple generators controllers. The secondary measurement device 31 may be an off-the-shelf module, a proprietary module, or a module designed specifically for an application. The secondary measurement device 31 may contain analog circuitry, digital circuitry, logic devices such as a processor or a field programmable gate array (FPGA), or a combination of analog, digital and logic. A communication device, which is an example communication means, may employ a car area network (CAN), serial communication, Ethernet communication, analog communication, wireless communication, communication on the power line, USB, or any combination thereof.

The synchronization device, which is an example synchronization means, may utilize be a zero-crossing on the waveform, a pulse on the communication lines, a message sent over the communications, a pulse coupled on the AC waveform, a separate channel or a GPS signal, among other synchronization techniques.

Figure 6:
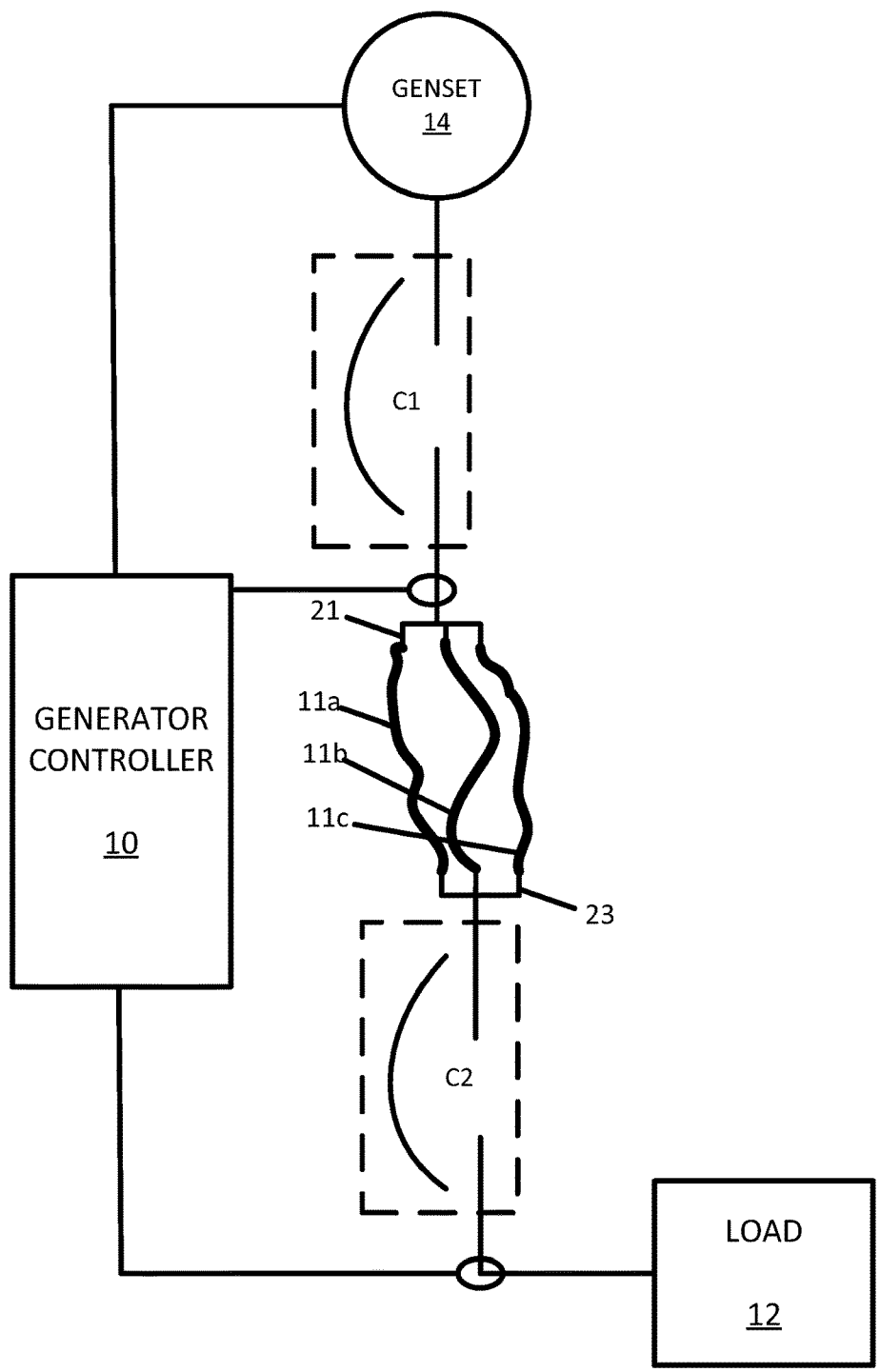
FIG. 6 illustrates an example single phase generator system with parallel cables.

FIG. 6 illustrates an example single phase generator system with parallel cables. The generator cable may be divided into any number of cable components such as cables 11a, 11b, and 11c. Any number of components may be used. The cable components may be connected with a multipoint tap 21 to the breaker 52G or the genset 14. The cable components may be connected with another multipoint tap 23 to the breaker 52L or the load 12. The multipoint tap may include that electrically connects ends of the cable components 11a, 11b, and 11c.

The generator controller 10 may compare resistance calculations among the cable components. The generator controller 10 may receive multiple first signals indicative of a generator output of a generator cable with each of the first signals corresponding to a different one of the cable components 11a, 11b, and 11c. The generator controller 10 may receive multiple second signals indicative of a second connection of the generator cable with each of the second signals corresponding to a different one of the cable components 11a, 11b, and 11c.

The generator controller 10 is configured to calculate a resistance for each of the cable components 11a, 11b, and 11c based on the first signals and the second signals. The generator cable 10 is configured to compare the resistance for each of the cable components to each other. In one implementation, the average of the resistance values of the cable components 11a, 11b, and 11c from a prior same (e.g., measurement of resistance made previously in time) is considered a threshold value. The generator controller 10 compares the current resistance measurements for the cable components 11a, 11b, and 11c to the threshold value. In another example, the average of the current resistance measurements for the cable components 11a, 11b, and 11c is considered a threshold value, and the generator controller 10 identifies when one of the cable components deviates from the other two.

The generator controller 10 is configured to identify which of the cable components deviates from the threshold resistance. The generator controller 10 is configured to generate any of the generator status messaged or any of the generator commands in response to the comparison. The generator controller 10 may insert or include a cable component identifier such as an alphanumeric characteristic which may be stamped or tagged on the cable component or label on the tap connection (e.g., cable 1, cable 2, cable 3). Alternatively, cable component identifier may correspond to different phases in a three phase system.

Thus, when three, or another number of two or more, cable components are used, the generator controller 10 identifier which of the components is performing erratically.

Figure 7:
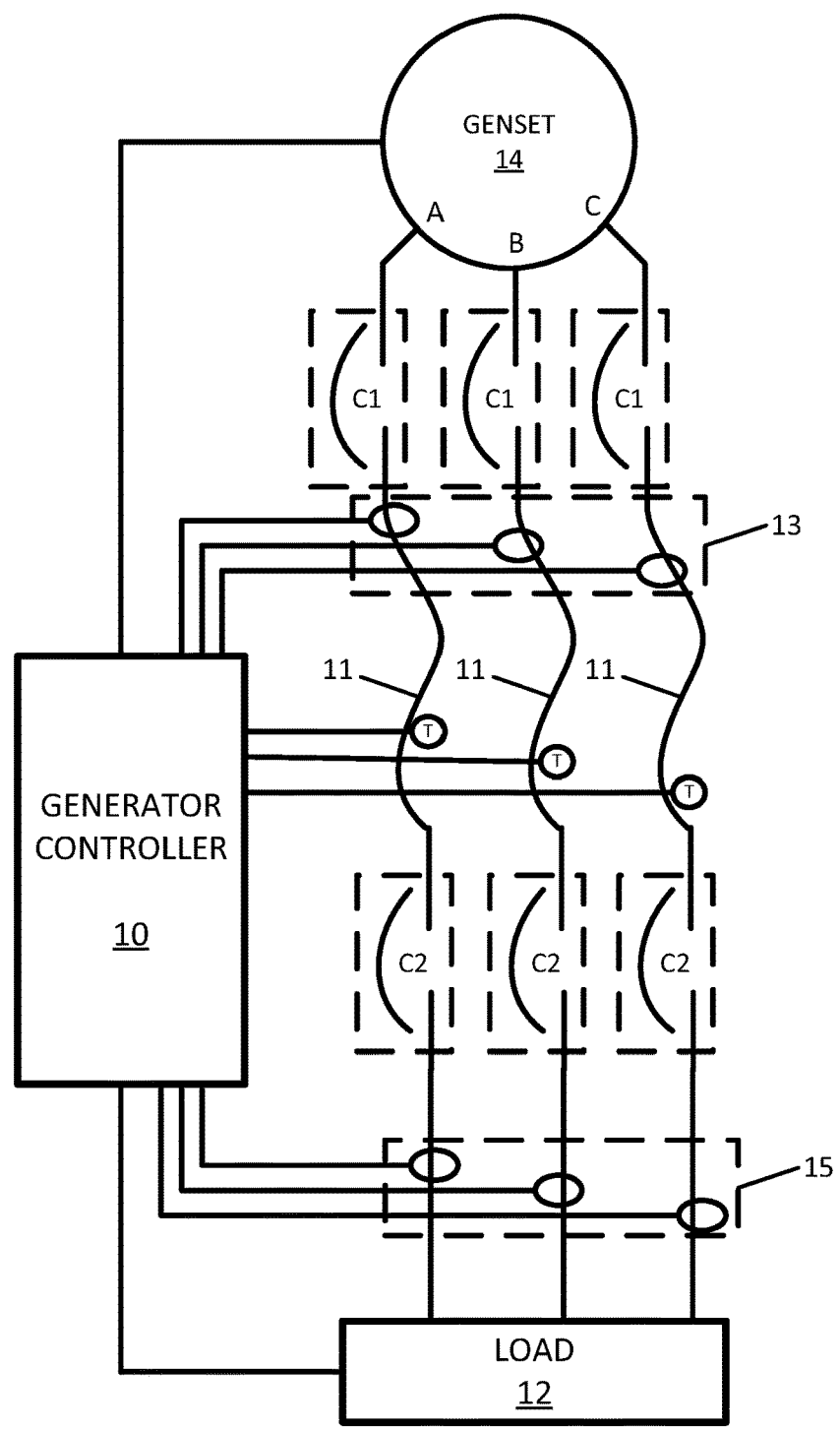
FIG. 7 illustrates an example three phase generator system for cable measurement.

FIG. 7 illustrates an example three phase generator system for cable measurement. The three phases, labeled A, B, and C and at genset 14, may each include a sinusoidal power signal that is approximately 120 degrees out of phase with the other two power signals. In addition to elements described in earlier embodiments, the example of FIG. 7 includes one or more temperature sensors T and a first cable measurement assembly 13 and a second cable measurement assembly 15.

The first cable measurement assembly 13 and the second cable measurement assembly 15 may include an enclosure for measuring the electrical parameters of the cable 11. The measurement assemblies may include current transformers. The measurement assemblies may include an array of sensors including voltage sensors and/or current sensors. Additional, different, or fewer components may be included.

The temperature of the cable 11 may substantially affect the resistance of the cable 11. The conductive portion of the cable 11, which may be any metal, is associated with a thermal coefficient. Example units for the thermal coefficient include resistance per unit temperature. Examples includes 1 ohm per degree Celsius or 5/9 of an ohm per degree of Fahrenheit.

Different thermal coefficients apply to different materials. The generator controller 10 may include a lookup table that associates conducts with thermal coefficients. The lookup table may include copper, aluminum, iron, or other metals. The generator controller 10 may receive an input setting from a user that indicates the material of the conductor, the model of the cable 11, or a code printed on the cable 11. Based on the input setting, the generator controller 10 queries the lookup table to select the thermal coefficient for the cable 11.

Through measurement of the temperature, the generator controller 10 may monitor the resistance in the cables 11 taking into consideration of the thermal coefficient of the cable 11. In one example, the generator controller 10 may create a baseline based on the temperature. For example, the generator controller receives the first and second signals for electrical parameter measurements on opposing ends of the cable to calculate a baseline resistance. The baseline resistance is associated with the baseline temperature, which may be an ambient temperature. The generator controller 10 may determine a base line temperature measurement from temperate sensor T to set the baseline temperature, in response to starting the genset 14 or based on a predetermined time period.

Subsequent measurement of the resistance of the cable 11 may be adjusted according to temperature. For example, the generator controller 10 may calculate the resistance of the cable 11 based on the electrical parameters as described in the examples above and then adjust the resistance according to temperature. The generator controller 10 may calculate a change in resistance according to a difference between the baseline resistance and the current resistance for the cable 11. The generator controller 10 may calculate a change in temperature based on the difference between the baseline temperature and the current temperature.

The generator controller may adjust the change in resistance based on the change in temperature. For example, the change in temperature multiplied by the expected thermal coefficient for the cable 11. The resultant value, which may be referred to as an adjusted resistance for the cable, may be compared to the threshold value. The adjusted resistance may be the resistance to the cable after temperature changes are accounted for.

In another example, resistance is monitored as an indicator of temperature. The temperature of the generator cable 11 may increase because of a malfunction in the cable 11, overheating of another component in proximity of the cable 11, or another inadvertent placement of the cable 11. The malfunction in the cable 11 may be increased heat caused by one or more of increased resistance from a loose connection, corrosion or damage to the conductor, a lack of airflow in a region of the cable, a heat sources near the cable, or radiant heating (e.g., sunlight). The overheating of another component may cause the cable 11 to heat up based on physical proximity. For example, the cable 11 may be inadvertently placed near the engine of the genset 11. The cable 11 may also be inadvertently placed when the cable 11 is bunched together, coiled around itself, or folded upon itself.

When the temperature of the cable 11 increases, the generator controller 11 detects the corresponding resistance change. In response to the identification of the increased resistance change, and cause the genset 14 to be shut down or current to be diverted from the cable 11. Thus, the overheating cable 11 is prevented from further overheating and melting the insulation of the cable 11. If the insulation of the cable 11 was allowed to melt without a controlled change in operation, the possibility of a short-circuit increases significantly due to the insulation losing much of its strength. Thus, the generator controller 10 correcting the overheating cable 11 may prevent further failure in the system.

The generator controller 10 may also detect the size (e.g., gauge and/or length) of the generator cable 11 based on the resistance change and/or temperature of the generator cable 11. The conductivity of the conductive portion of the generator cable 11 is proportional to the size of the generator cable 11. Power is equivalent or proportional to the square of current times resistance ($P=I^2R$).

The resistance of the cable decreases with increasing cable size and increases with cable length, while the power dissipated by the cable at a given temperature difference increases with both dimensions. Given that the two dimensional variables have varying effects on the behavior of the cable, it is reasonable to use the cable behavior to determine critical coefficients regarding the size and length of the cable.

As an example, the power dissipated in the cable is the product of the current through the cable (measured by a sensor) and the voltage across the cable (measured by a sensor or pair of sensors). The resistance of the cable is the quotient of the voltage across the cable and the current through the cable.

The temperature of the cable may be determined by direct measurement or by a change in resistance since the system started. If the power is known, the ambient temperature is known and the cable temperature is known, the total power dissipated at a 1° temperature difference may be computed by dividing the dissipated power by the temperature difference.

The cable resistance at 20° C. can be computed by subtracting the cable temperature from 20° C. and applying the factor, multiplied by the temperature coefficient of the cable, to the measured resistance. The dissipated power per unit (1°) temperature difference may be used to determine several cells in a lookup table. The wire size and length may be determined using a table similar to Table 1, Table 2, or Table 3, a combination of the tables, or additional tables.

TABLE 1

| Resistance (Ω) | Length (m) | | | | | | | | | |
|---|---|---|---|---|---|---|---|---|---|---|
| | 8 | 16 | 25 | 30 | 50 | 70 | 100 | 300 | 1000 | 3000 |
| Size 14 | 0.07 | 0.13 | 0.21 | 0.25 | 0.41 | 0.58 | 0.83 | 2.49 | 8.29 | 24.86 |
| 12 | 0.04 | 0.08 | 0.13 | 0.16 | 0.26 | 0.36 | 0.52 | 1.56 | 5.21 | 15.63 |
| 10 | 0.03 | 0.05 | 0.08 | 0.10 | 0.16 | 0.23 | 0.33 | 0.98 | 3.28 | 9.83 |
| 8 | 0.02 | 0.03 | 0.05 | 0.06 | 0.10 | 0.14 | 0.21 | 0.62 | 2.06 | 6.18 |
| 6 | 0.01 | 0.02 | 0.03 | 0.04 | 0.06 | 0.09 | 0.13 | 0.39 | 1.30 | 3.89 |
| 4 | 0.01 | 0.01 | 0.02 | 0.02 | 0.04 | 0.06 | 0.08 | 0.24 | 0.82 | 2.45 |
| 2 | 0.00 | 0.01 | 0.01 | 0.02 | 0.03 | 0.04 | 0.05 | 0.15 | 0.51 | 1.54 |
| 1 | 0.00 | 0.01 | 0.01 | 0.01 | 0.02 | 0.03 | 0.04 | 0.12 | 0.41 | 1.22 |
| 2/0 | 0.00 | 0.00 | 0.01 | 0.01 | 0.01 | 0.02 | 0.03 | 0.08 | 0.26 | 0.77 |
| 4/0 | 0.00 | 0.00 | 0.00 | 0.00 | 0.01 | 0.01 | 0.02 | 0.05 | 0.16 | 0.48 |
| 350 MCM | 0.00 | 0.00 | 0.00 | 0.00 | 0.00 | 0.01 | 0.01 | 0.03 | 0.10 | 0.30 |
| 500 MCM | 0.00 | 0.00 | 0.00 | 0.00 | 0.00 | 0.00 | 0.01 | 0.02 | 0.07 | 0.21 |
| 750 MCM | 0.00 | 0.00 | 0.00 | 0.00 | 0.00 | 0.00 | 0.00 | 0.01 | 0.05 | 0.14 |
| 1000 MCM | 0.00 | 0.00 | 0.00 | 0.00 | 0.00 | 0.00 | 0.00 | 0.01 | 0.03 | 0.10 |

TABLE 2

| Power (W) @ 1° C. | Length (m) | | | | | | | | | |
|---|---|---|---|---|---|---|---|---|---|---|
| | 8 | 16 | 25 | 30 | 50 | 70 | 100 | 300 | 1000 | 3000 |
| Size 14 | 0.994 | 1.989 | 3.107 | 3.729 | 6.215 | 8.7 | 12.43 | 37.29 | 124.3 | 372.9 |
| 12 | 1.112 | 2.223 | 3.474 | 4.169 | 6.948 | 9.727 | 13.9 | 41.69 | 139 | 416.9 |
| 10 | 1.322 | 2.643 | 4.13 | 4.956 | 8.261 | 11.57 | 16.52 | 49.56 | 165.2 | 495.6 |
| 8 | 1.759 | 3.517 | 5.496 | 6.595 | 10.99 | 15.39 | 21.98 | 65.95 | 219.8 | 659.5 |
| 6 | 1.905 | 3.81 | 5.954 | 7.144 | 11.91 | 16.67 | 23.81 | 71.44 | 238.1 | 714.4 |
| 4 | 2.13 | 4.261 | 6.657 | 7.989 | 13.31 | 18.64 | 26.63 | 79.89 | 266.3 | 798.9 |
| 2 | 2.468 | 4.936 | 7.712 | 9.254 | 15.42 | 21.59 | 30.85 | 92.54 | 308.5 | 925.4 |
| 1 | 2.624 | 5.248 | 8.2 | 9.84 | 16.4 | 22.96 | 32.8 | 98.4 | 328 | 984 |
| 2/0 | 3.068 | 6.137 | 9.589 | 11.51 | 19.18 | 26.85 | 38.36 | 115.1 | 383.6 | 1151 |
| 4/0 | 3.517 | 7.033 | 10.99 | 13.19 | 21.98 | 30.77 | 43.96 | 131.9 | 439.6 | 1319 |
| 350 MCM | 3.996 | 7.993 | 12.49 | 14.99 | 24.98 | 34.97 | 49.95 | 149.9 | 499.5 | 1499 |
| 500 MCM | 3.918 | 7.836 | 12.24 | 14.69 | 24.49 | 34.28 | 48.98 | 146.9 | 489.8 | 1469 |
| 750 MCM | 4.456 | 8.913 | 13.93 | 16.71 | 27.85 | 38.99 | 55.7 | 167.1 | 557 | 1671 |
| 1000 MCM | 4.637 | 9.274 | 14.49 | 17.39 | 28.98 | 40.57 | 57.96 | 173.9 | 579.6 | 1739 |

TABLE 3

| Energy (J) for 1° C. rise | Length | | | | | | | | | |
|---|---|---|---|---|---|---|---|---|---|---|
| | 8 | 16 | 25 | 30 | 50 | 70 | 100 | 300 | 1000 | 3000 |
| Size 14 | 0.862 | 1.724 | 2.693 | 3.232 | 5.386 | 7.541 | 10.77 | 32.32 | 107.72 | 323.1694 |
| 12 | 1.37 | 2.741 | 4.283 | 5.139 | 8.565 | 11.99 | 17.13 | 51.39 | 171.31 | 513.9246 |
| 10 | 2.178 | 4.356 | 6.806 | 8.167 | 13.61 | 19.06 | 27.22 | 81.67 | 272.23 | 816.6765 |
| 8 | 3.464 | 6.928 | 10.83 | 12.99 | 21.65 | 30.31 | 43.3 | 129.9 | 433.01 | 1299.038 |
| 6 | 5.506 | 11.01 | 17.21 | 20.65 | 34.41 | 48.18 | 68.82 | 206.5 | 688.24 | 2064.72 |
| 4 | 8.755 | 17.51 | 27.36 | 32.83 | 54.72 | 76.61 | 109.4 | 328.3 | 1094.4 | 3283.136 |
| 2 | 13.92 | 27.85 | 43.51 | 52.22 | 87.03 | 121.8 | 174.1 | 522.2 | 1740.6 | 5221.654 |
| 1 | 17.56 | 35.11 | 54.86 | 65.84 | 109.7 | 153.6 | 219.5 | 658.4 | 2194.5 | 6583.545 |
| 2/0 | 27.92 | 55.83 | 87.24 | 104.7 | 174.5 | 244.3 | 349 | 1047 | 3489.7 | 10469.02 |
| 4/0 | 44.38 | 88.78 | 138.7 | 166.5 | 277.4 | 388.4 | 554.9 | 1665 | 6.E+03 | 2.E+04 |
| 350 MCM | 73.45 | 146.9 | 229.5 | 275.4 | 459.1 | 642.7 | 918.2 | 2754 | 9.E+03 | 3.E+04 |
| 500 MCM | 104.9 | 209.8 | 327.8 | 393.3 | 655.5 | 917.7 | 1311 | 3933 | 1.E+04 | 4.E+04 |
| 750 MCM | 157.4 | 314.7 | 491.8 | 590.2 | 983.6 | 1377 | 1967 | 5902 | 2.E+04 | 6.E+04 |
| 1000 MCM | 209.8 | 419.6 | 655.6 | 786.7 | 1311 | 1836 | 2622 | 7867 | 3.E+04 | 8.E+04 |

The resistance of the wire may be computed as the ratio of the voltage to the current. The power dissipated in the wire may be calculated as the instantaneous product of the current through the wire and the voltage across it. The heat dissipated into the wire (in Joules) can be derived by integrating (summing) the measured the power into the wire over time. Thus, all quantities used in these tables can be derived by the measured parameters and the results compared to provide more precise wire size determination.

Although a given resistance may relate to multiple wire sizes at different lengths and a given heat capacity may relate with multiple wire sizes at different lengths, the direction of the trends of the data tables makes it unlikely that more than a single point will overlap the tables. For example, a resistance of 0.02 ohms (20 mOhm) could potentially indicate 12 m of 8 AWG wire, 16 m of 6 AWG wire, 25 m of 4 AWG wire, 40 m of 2 AWG wire, 50 m of 1 AWG wire, etc. but the measured heat capacity of 11 J/° C. would only match the 16 m of 6 AWG wire in the heat capacity table. Other entries for 11 J/° C., such as 6 m of 4 AWG, 25 m of 8 AWG or 100 m of 14 AWG, do not match expected resistance for such a size and length.

The cell that most closely matches the measured resistance at 20° C. will most likely point to the appropriate wire gauge. Some heat dissipation factors may be dependent on airflow and insulation type, but the generator controller may calibrate these factors out or allow them to be selected by a user.

Figure 8:
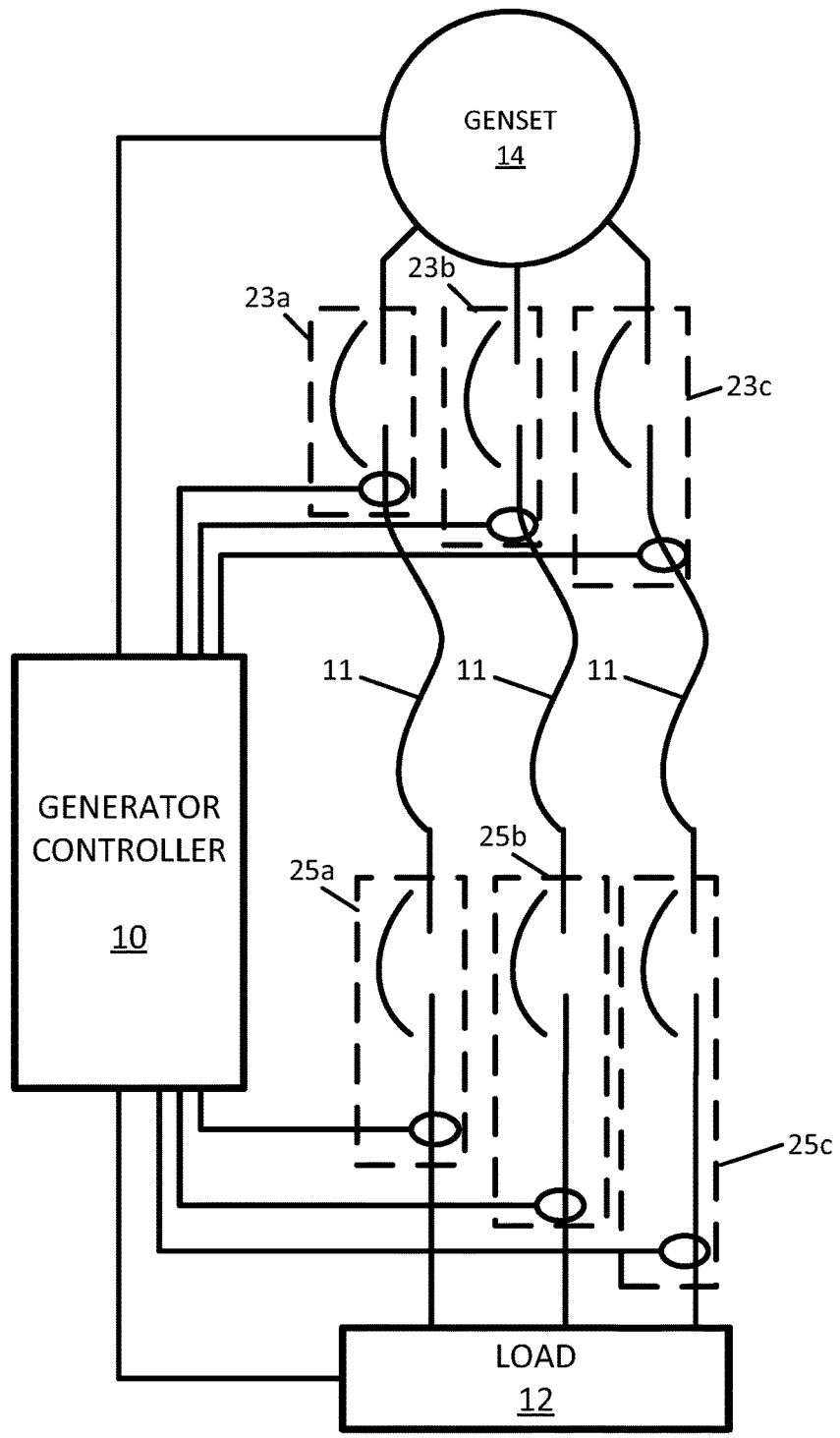
FIG. 8 illustrates an example three phase generator system for cable measurement integrated with breakers.

FIG. 8 illustrates an example three phase generator system for cable measurement integrated with breakers. Each of the breakers or switches (e.g., breakers 52G and 52L) may be integrated with a cable measurement device. For example, combined switch and cable measurement devices 23*a-c* connect the source side of the generator cable 11 to the generator 15, and combined switch and cable measurement device 25*a-c* connect the load side of the generator cable 11 to the generator 15.

Figure 9:
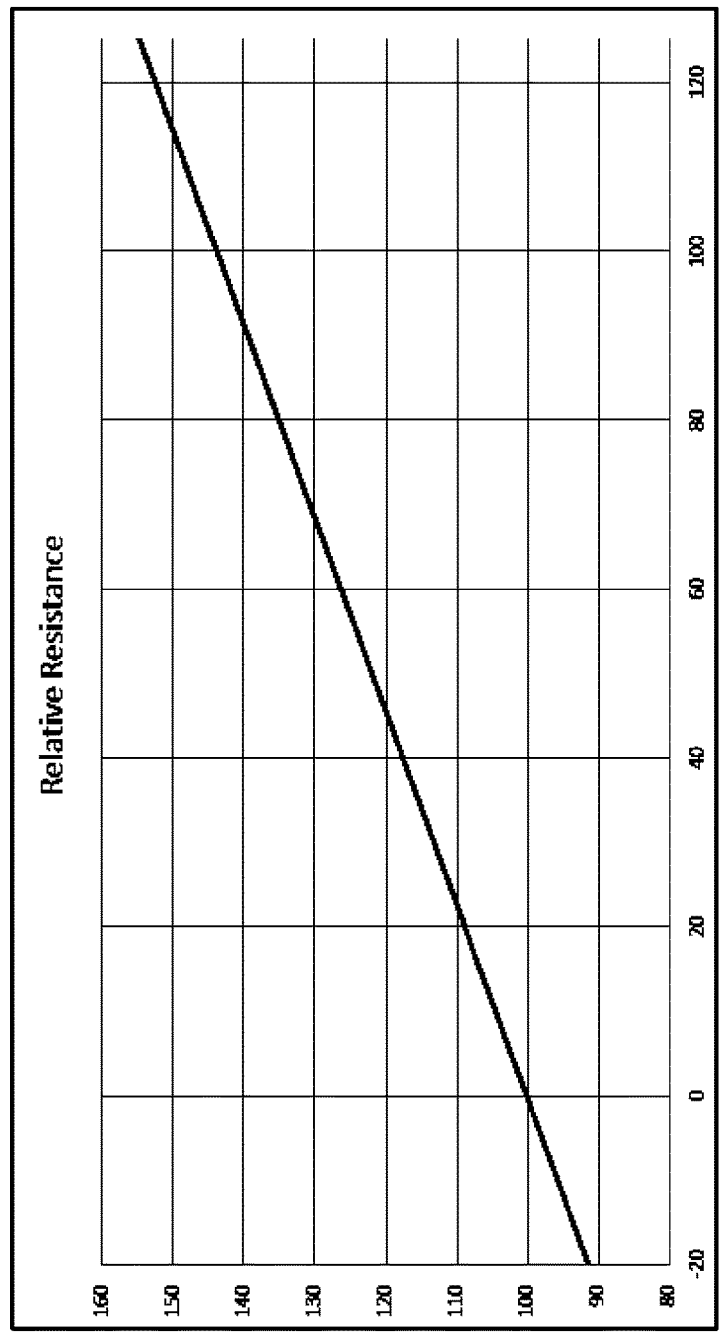
FIG. 9 illustrates an example relationship for calculating temperature based on resistance.

FIG. 9 illustrates an example relationship for calculating temperature based on resistance. The resistance of the cable, as shown on the vertical axis, may vary linearly according to temperature, as shown in the horizontal axis, as described in the preceding examples. The numerical values for resistance are shown for example only and may be a total resistance (e.g., ohms or kiloohms) or a resistance per unit length (e.g., ohms per meter). The numerical values for temperature may be any units such as Fahrenheit, Celsius, or Kelvin.

FIG. 10 illustrates example output messages in response to the cable measurement. The generator controller 10 may include an analog to digital converter (ADC) to convert the analog calculation of the resistance value for the cable 11 to a digital value, which may be included in the status message. The difference in electrical properties of the ends of the cable 11 may be analog signals that are subtract and divided by the current level of the generator cable 11 to determine the resistance value that is represented by a digital value. Various resolution levels for the ADC may be used such as 4 bits, 8 bits, or 16 bits, which has over 65000 counts possible.

In one example, the generator controller 10 may switch resolution for the resolution value based on previous comparison of the resistance value with the threshold. For example, the generator controller 10 may compare the resistance to the threshold using a first resolution (e.g., low resolution such as 4 bits). The generator controller 10 is configured to detect when the resistance varies from the threshold by a predetermined range, and in response, increase the resolution to a second resolution (e.g., high resolution such as 16 bits) for one or more subsequent comparisons. The high bit resistance value may be included in the status message.

Additional examples for the generator command may include a load shedding command or a paralleling command. The generator controller 10 may be electrically coupled to multiple gensets. The gensets may be electrically coupled to one another for providing power to the load 12. The generator controller 10 may generate commands to close one or more breakers in order to parallel the generators. The commands for the breakers may coincide with voltage levels or frequencies of the gensets. The generator controller may cause the genset to be connected in parallel, through closing one or more breakers, in response to the comparison of the resistance for the generator cable to a threshold value. For example, the generator controller 10 may proceed with paralleling only when the resistance of the generator cables are within an expected range. The generator controller 10 may remove a genset from being paralleled with other genset in response to the comparison. The parallel command may include an instruction to closes a generator (e.g., genset 14) to the bus such as closing the generator side beaker 52G.

The paralleled gensets may each supply power to the load 12. Different gensets may supply different ratios of the power. The ratios may depend on the ratings of the gensets. The ratios of power may depend on a load shedding command the comparison of the resistance for the generator cable to a threshold value. In another example, the load shedding command may disconnect one or more loads from the genset. The load shedding command may open a breaker between the cable and the genset to the load. In one example, when multiple cable components are used, and one of the cable components includes a resistance higher than the threshold, the load shedding command may reduce the load on the genset to a level within the current ratings of the remaining cable components. The load shedding command may be generated in addition to, and in cooperation with, a breaker command to disconnect the generator cable with the high resistance.

The generator controller 10 may monitor the inductance in the cable 11. The inductance may be measured as a resistance from RMS values. The inductance may be measured as the imaginary component in a complex impedance as established by measurement of RMS amplitude and phase of both the current and voltage and dividing the complex quantities. The inductance may also be measured by comparing the signal time constant to the quotient of the inductance and the resistance. The inductance may be calculated using a phase shift lookup from the phase between the voltage and current by multiplying the resistance of the cable by the tangent of the phase between voltage and current. The inductance may be measured by dividing the square of the voltage by the measured reactive power for a given phase. Other examples to measure inductance also exist that are commonly understood in the art.

In a generator system, a change in resistance as detected at any given generator may be depend on the inductance in the cable 11 because the cable's inductance acts as a filter between the generators.

Figure 11:
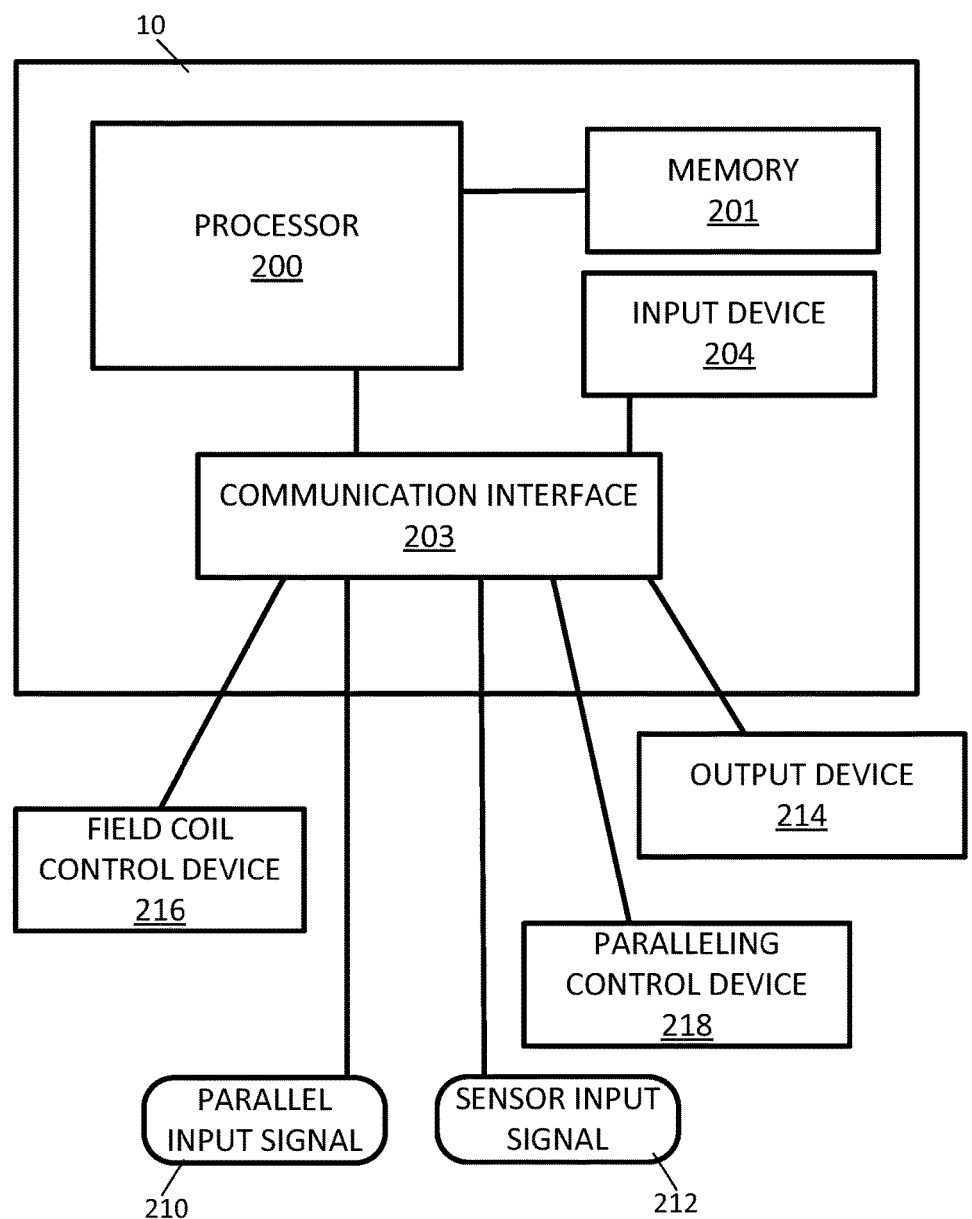
FIG. 11 illustrates an example generator controller.
Figure 12:
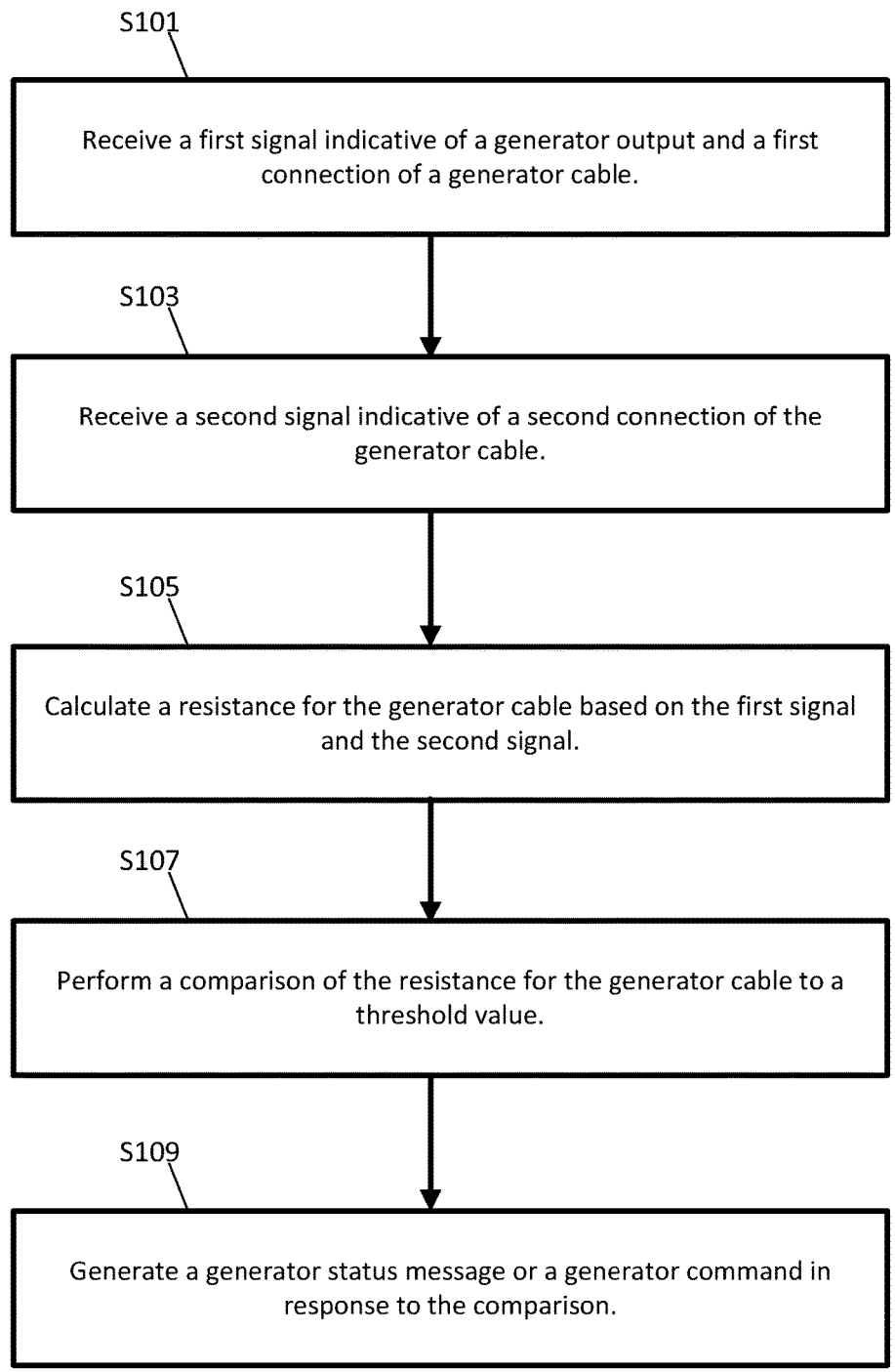
FIG. 12 illustrates an example flowchart for operation of the generator controller of FIG. 11.

FIG. 11 illustrates an example controller (e.g., generator controller 10). The controller may include a processor 200, a memory 201, and a communication interface 203. The communication interface 203 may communicate with a parallel input signal 210, a sensor input signal 212, a display device 214, an input device 204, field coil control device 216, and a paralleling control device 218. Additional, different, or fewer components may be included. FIG. 12 illustrate an example flowchart for operation of the controller of FIG. 11 for monitoring the operation of a generator cable. Additional, different, or fewer acts may be included.

At act S101, the processor 200 or the communication interface 203 receives a first signal indicative of a generator output and a first connection of a generator cable. The communication interface may include an example means for receiving a first signal indicative of a generator output and a first connection of a generator cable. The first and second signals may be a sensor input signal 212 received from a sensor such as a voltage sensor or a current sensor. The sensor input signal 212 may include a first electrical path for the first signal indicative of the generator output and the first connection of a generator cable.

At act S103, the processor 200 performs or the communication interface 203 receives a second signal indicative of a second connection of the generator cable. The communication interface may include a means for receiving a second signal indicative of a second connection of the generator cable. The sensor input signal 212 may include a second electrical path for a second signal indicative of a second connection of the generator cable.

At act S105, the processor 200 calculates a resistance for the generator cable based on the first signal and the second signal. The processor 200 may include a module or may be apportioned to include an application specific controller or integrated circuit as a means for calculating a resistance for the generator cable based on the first signal and the second signal.

At act S107, the processor 200 performs a comparison of the resistance for the generator cable to a threshold value. The processor 200 may include a module or may be apportioned to include an application specific controller or integrated circuit as a means for performing a comparison of the resistance for the generator cable to a threshold value At act S109, the processor 200 generates an output message such as a generator status message or a generator command in response to the comparison. The output message may be displayed on an output device 214, which may include a handheld or mobile device (e.g., laptop, cellular phone or tablet) or another computer. The output device 214 may include a control panel of the generator, which may be a touchscreen or liquid crystal display. The output device 214 may include one or more lights or light emitting diode (LED). When multiple LEDs are used, each LED may correspond to a different type of message (e.g., one LED corresponds to a diagnostic message, one LED corresponds to a warning message, one LED corresponds to a fault message). Other patterns are possible for a sequence of lights for the type, degree, or frequency of the output messages.

In another example, the processor 200 generates an output for a field current control device 216. The field current control device 216 generates a field current control signal that sets the level of the field current that drives the field coils of the alternator and determines the output of the alternator of the genset. The amplitude of the field current or the frequency of the field current may be adjusted by the field coil control device 216. The field coil control device 216 may include an amplifier circuit and/or oscillator for controlling the field current. An input to the field coil control device 216 may be a battery, an inductive source, or another source. In some examples, the processor 200 may decrease the field current when the resistance of the generator cable indicates a problem in the cable.

Figure 13:
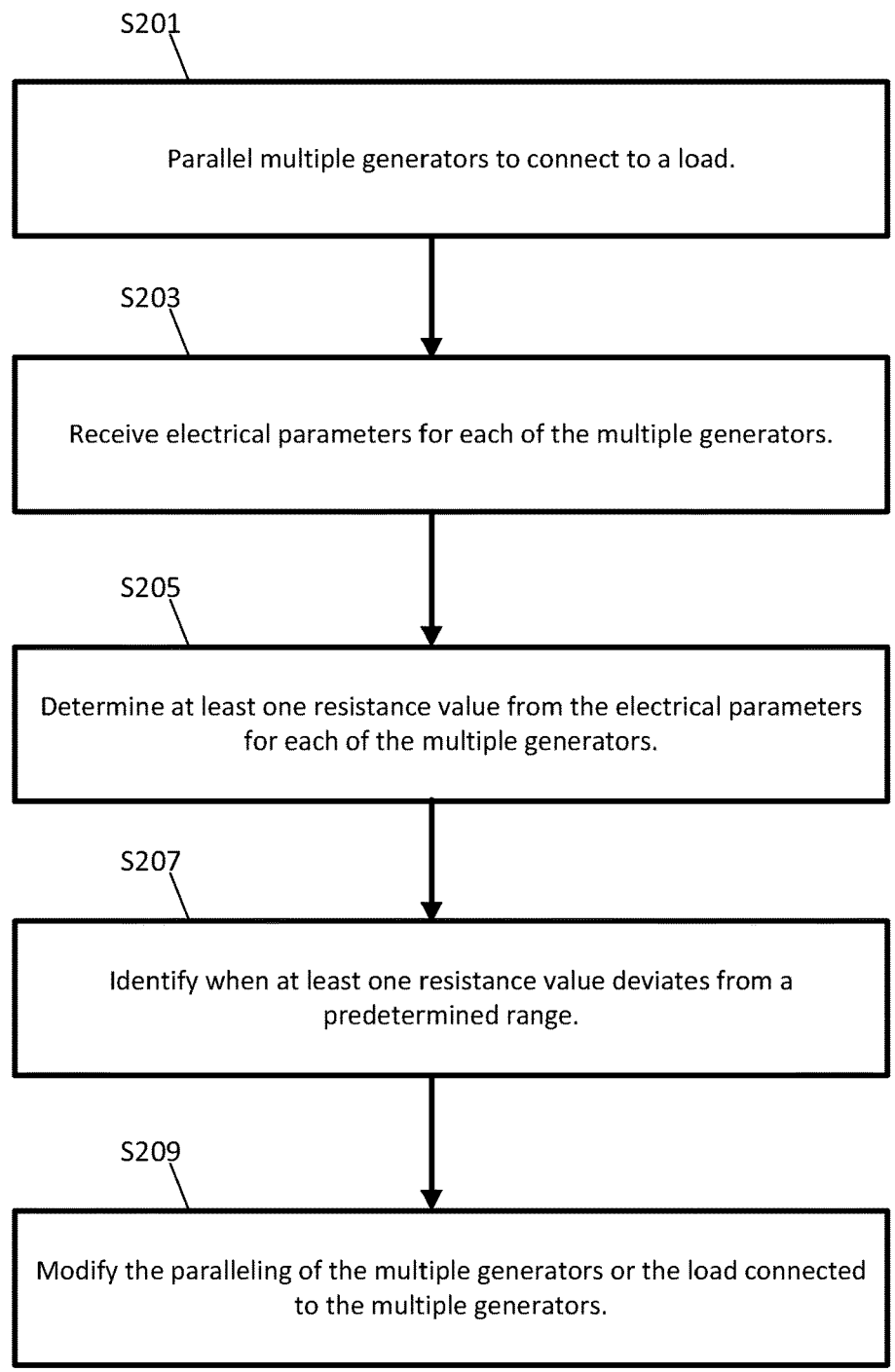
FIG. 13 illustrates another example flowchart for operation of the generator controller of FIG. 11.

FIG. 13 illustrates another example flowchart for operation of the generator controller 10 of FIG. 11. The generator controller 10 may control multiple generators that are coupled with a common generator bus. Additional, different, or fewer acts may be included.

At act S201, the processor 200 controls multiple generators in parallel operation. The processor 200 may generate commands to parallel multiple generators to connect to a load. The processor 200 may instruct the paralleling control device 218 to send paralleling commands to other devices. In one example, the paralleling control device 218 communicators with various generator controllers of the parallel multiple generators. In another example, the paralleling control device 218 sends the parallel commands to breakers configured to open and close (decouple and couple) the parallel multiple generators to the common generator bus.

The paralleling command may close generators to the common generator bus in response to a parallel input signal 210 including data indicative of one or more factors. The one or more factors may include each generator reaching a predetermined output, synchronizing with a predetermined frequency or in synch with a phase offset of the common generator bus, and any generators that are already connected to the common generator bus. The generator controller 10 may instruct breakers to close to the bus as these factors are met. A synchronization signal may be used to prevent unsynchronized generators from simultaneously (or too close to simultaneously) closing to the common generator bus.

At act S203, the processor 200 a communication interface 203 receives electrical parameters for each of the multiple generators. The electrical parameters may be detected from an analog values in the sensor input signal 212. The electrical parameters may be data communicated by the sensor input signal 212. The electrical parameters may include resistances in respective generator cables of each of the multiple generators. The electrical parameters may include voltage levels and/or current levels, from which resistance values respective generator cables of each of the multiple generators are derived.

At act 205, the processor 200 determines at least one resistance value from the electrical parameters for each of the multiple generators. In one example, the resistance value is calculated from the voltage levels and/or current levels. In another example, the resistance value is determined through identification of the data received in the sensor input signal 212. At act 207, the processor 200 identifies when at least one resistance value deviates from a predetermined range. The processor 200 may compare resistance values to a threshold resistance or a predetermined range of resistances.

At act 209, the processor 200 modifies the paralleling of the multiple generators or the load connected to the multiple generators. For example, the processor 200 may instruct the paralleling control device 218 to send paralleling commands to other devices in response to the comparison of the resistance value and the predetermined range. The paralleling control device 218 communicators with various generator controllers of the parallel multiple generators send the parallel commands to breakers configured to open and close (decouple and couple) the parallel multiple generators to the common generator bus in response to the comparison. When a generator that is paralleled includes a cable with a deviating resistance, that generator may be removed from the common generator bus by opening the corresponding breaker. The processor 200 may generator the paralleling command based on a combination of the parallel input signal 210 and the result of the comparison.

The processor 200 may include a general processor, digital signal processor, an application specific integrated circuit (ASIC), field programmable gate array (FPGA), analog circuit, digital circuit, combinations thereof, or other now known or later developed processor. The processor 200 may be a single device or combinations of devices, such as associated with a network, distributed processing, or cloud computing.

The memory 201 may be a volatile memory or a non-volatile memory. The memory 201 may include one or more of a read only memory (ROM), random access memory (RAM), a flash memory, an electronic erasable program read only memory (EEPROM), or other type of memory. The memory 201 may be removable from the network device, such as a secure digital (SD) memory card.

In addition to ingress ports and egress ports, the communication interface 303 may include any operable connection. An operable connection may be one in which signals, physical communications, and/or logical communications may be sent and/or received. An operable connection may include a physical interface, an electrical interface, and/or a data interface.

The communication interface 203 may be connected to a network. The network may include wired networks (e.g., Ethernet), wireless networks, or combinations thereof. The wireless network may be a cellular telephone network, an 802.11, 802.16, 802.20, or WiMax network. Further, the network may be a public network, such as the Internet, a private network, such as an intranet, or combinations thereof, and may utilize a variety of networking protocols now available or later developed including, but not limited to TCP/IP based networking protocols.

While the computer-readable medium (e.g., memory 201) is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored. The computer-readable medium may be non-transitory, which includes all tangible computer-readable media.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Processors suitable for the execution of a computer program include, by way of example, both general and special purpose microprocessors, and anyone or more processors of any kind of digital computer. Generally, a processor may receive instructions and data from a read only memory or a random access memory or both. The essential elements of a computer are a processor for performing instructions and one or more memory devices for storing instructions and data. Generally, a computer may also include, or be operatively coupled to receive data from or transfer data to, or both, one or more mass storage devices for storing data, e.g., magnetic, magneto optical disks, or optical disks. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the FIGURES are to be regarded as illustrative rather than restrictive.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

It is intended that the foregoing detailed description be regarded as illustrative rather than limiting and that it is understood that the following claims including all equivalents are intended to define the scope of the invention. The claims should not be read as limited to the described order or elements unless stated to that effect. Therefore, all embodiments that come within the scope and spirit of the following claims and equivalents thereto are claimed as the invention.

We claim:

1. A method for monitoring a generator cable of a generator system including a prime mover and an alternator:
   receiving a first signal indicative of a generator output and a first connection of a generator cable connected to the alternator;
   receiving a second signal indicative of a second connection of the generator cable connected to a load supplied by the alternator;
   calculating a characteristic value for the generator cable based on the first signal and the second signal;
   receiving temperature data for the generator cable;
   calculating a threshold value from the temperature data and at least one generator cable property value;
   performing a comparison of the characteristic value for the generator cable to the threshold value calculated from the temperature data; and
   generating a generator command in response to the comparison.

2. The method of claim 1, wherein the threshold value is based on a previous characteristic value calculation for the generator cable.

3. The method of claim 1, wherein the generator cable is a first generator cable, and the threshold value is based on a characteristic value for a second generator cable.

4. The method of claim 1, further comprising:
   generating a generator status message in response to the comparison.

5. The method of claim 1, wherein the generator cable property value corresponds to a conductive material.

6. The method of claim 1, wherein the characteristic value is a resistance.

7. The method of claim 4, wherein the generator status message includes a length of the generator cable or a gauge of the generator cable.

8. The method of claim 7, wherein the generator status message includes a diagnostic message or an instruction to a user or includes a warning and data indicative of a remedial action.

9. The method of claim 1, wherein the generator command includes a breaker command to open or close a breaker in response to the comparison of the characteristic value for the generator cable to a threshold value.

10. The method of claim 1, wherein the generator command includes a load shedding command to reduce or increase the load in response to the comparison of the characteristic value for the generator cable to a threshold value.

11. The method of claim 1, wherein the generator command includes a shutdown command to shut down a generator of the generator system.

12. The method of claim 1, wherein the generator command includes a start command for another generator of the generator system.

13. An apparatus including a prime mover and an alternator comprising:
   a first electrical path for a first signal indicative of a generator output from the alternator and a first connection of a generator cable;
   a second electrical path for a second signal indicative of a second connection of the generator cable to a load supplied by the alternator; and
   a controller configured to calculate a characteristic value for the generator cable based on the first signal and the second signal, calculate a threshold value from temperature data and at least one generator cable property value, and perform a comparison of the characteristic value for the generator cable to the threshold value,
   wherein a generator status message or a generator command is provided in response to the comparison.

14. The apparatus of claim 13, wherein the threshold value is based on a previous resistance calculation for the generator cable.

15. The apparatus of claim 13, wherein the generator cable is a first generator cable, and the threshold value is based on a resistance calculation for a second generator cable.

16. The apparatus of claim 13, wherein the generator status message is provided and the generator status message includes a warning and data indicative of a remedial action.

17. The apparatus of claim 13, wherein the generator status message is provided and the generator status message includes a diagnostic message or an instruction to a user.

18. A generator comprising:
   a first breaker coupled to a first electrical path for a first signal indicative of a generator output and a first connection of a generator cable to an alternator of the generator;
   a second breaker coupled to a second electrical path for a second signal indicative of a second connection of the generator cable to a load powered by the alternator of the generator; and
   a controller configured to calculate a characteristic value for the generator cable based on the first signal and the second signal and perform a comparison of the characteristic value for the generator cable to a threshold value,
   wherein the controller is configured to modify the threshold value based on temperature data for the generator cable and at least one generator cable property value,
   wherein a generator status message or a generator command is provided in response to the comparison.

* * * * *

UNITED STATES PATENT AND TRADEMARK OFFICE
CERTIFICATE OF CORRECTION

PATENT NO.        : 10,114,061 B2
APPLICATION NO.   : 15/362297
DATED             : October 30, 2018
INVENTOR(S)       : Isaac Frampton et al.

Page 1 of 1

It is certified that error appears in the above-identified patent and that said Letters Patent is hereby corrected as shown below:

In the Claims

Claim 8, Column 21, Line 45. Please replace "claim 7" with -- claim 4 --.

Signed and Sealed this
Thirtieth Day of April, 2019

Andrei Iancu
*Director of the United States Patent and Trademark Office*